US012620437B2

(12) United States Patent
Penth et al.

(10) Patent No.: US 12,620,437 B2
(45) Date of Patent: May 5, 2026

(54) MEMORY DEVICE, ASSIST CELL AND DOUBLE ASSIST CELL FOR A MEMORY DEVICE

(71) Applicant: INTERNATIONAL BUSINESS MACHINES CORPORATION, Armonk, NY (US)

(72) Inventors: Wolfgang Penth, Holzgerlingen (DE); Jan Niklas Stegmaier, Sindelfingen (DE); Rolf Sautter, Bondorf (DE); Silke Penth, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 18/407,338

(22) Filed: Jan. 8, 2024

(65) Prior Publication Data

US 2025/0118360 A1      Apr. 10, 2025

(30) Foreign Application Priority Data

Oct. 4, 2023      (GB) ..................................... 2315196

(51) Int. Cl.
G11C 11/419        (2006.01)
G11C 11/418        (2006.01)
(52) U.S. Cl.
CPC .......... G11C 11/419 (2013.01); G11C 11/418 (2013.01)
(58) Field of Classification Search
CPC ............................ G11C 11/418; G11C 11/419
See application file for complete search history.

(56) References Cited

U.S. PATENT DOCUMENTS

| | | | |
|---|---|---|---|
| 10,559,352 B2 | 2/2020 | Shankar | |
| 10,978,142 B2 | 4/2021 | Su | |
| 11,043,262 B2 | 6/2021 | Madhavan | |
| 11,062,766 B2 | 7/2021 | Siddiqui | |
| 11,211,116 B2 | 12/2021 | Yang | |
| 11,605,423 B2 | 3/2023 | Lim | |

(Continued)

OTHER PUBLICATIONS

Lien, et al., "A 40 nm 512 kb Cross-Point 8 T Pipeline SRAM With Binary Word-Line Boosting Control, Ripple Bit-Line and Adaptive Data-Aware Write-Assist," IEEE Transactions on Circuits and Systems I: Regular Papers, Dec. 2014 [accessed on Oct. 19, 2023], pp. 3416-3425. vol. 61, Issue 12, IEEE, DOI: 10.1109/TCSI.2014. 2336531, Retrieved from the Internet: <URL: https://ieeexplore. ieee.org/document/6891326>.

(Continued)

*Primary Examiner* — Min Huang
(74) *Attorney, Agent, or Firm* — Teddi E. Maranzano

(57) ABSTRACT

A memory device comprising at least one memory bank is provided and comprises a two-dimensional array of memory cells, a plurality of local bit lines connecting all memory cells in a first dimension of the two-dimensional array, a plurality of word lines connecting all memory cells in a second dimension of the two-dimensional array. The memory device further comprises at least one array of assist cells per memory bank, each array having one shared sense line and being arranged along memory cells and connected to by a bit line. The assist cells are configured as modified memory cells with a common sense line to provide a sense amplifier functionality. An assist cell and a double assist cell for a memory device are also provided.

19 Claims, 6 Drawing Sheets

(56) References Cited

U.S. PATENT DOCUMENTS

| | | | |
|---|---|---|---|
| 2003/0117874 | A1 | 6/2003 | Lee |
| 2008/0112244 | A1 | 5/2008 | Teramoto |
| 2008/0175088 | A1 | 7/2008 | Choi |
| 2013/0039120 | A1 | 2/2013 | Moriwaki |
| 2013/0083592 | A1 | 4/2013 | Kang |
| 2013/0148415 | A1 | 6/2013 | Shu |
| 2015/0138863 | A1 | 5/2015 | Roy |
| 2015/0357032 | A1 | 12/2015 | Tatsumura |
| 2016/0012868 | A1 | 1/2016 | Moon |
| 2019/0267053 | A1 | 8/2019 | Sreenivasula Reddy et al. |
| 2021/0158865 | A1 | 5/2021 | Gupta |
| 2022/0139442 | A1* | 5/2022 | Choi ..................... G11C 11/418 |
| | | | 365/185.13 |
| 2022/0208239 | A1 | 6/2022 | Pilo |
| 2023/0042652 | A1 | 2/2023 | Bhavnagarwala |
| 2023/0069721 | A1* | 3/2023 | Lin ....................... G11C 11/412 |
| 2023/0075959 | A1* | 3/2023 | Liu .......................... G11C 8/08 |
| 2023/0122135 | A1 | 4/2023 | Yang |

OTHER PUBLICATIONS

Lu, et al., "A 0.33-V, 500-KHz, 3.94-μW 40-nm 72-Kb 9T Sub-threshold SRAM With Ripple Bit-Line Structure and Negative Bit-Line Write-Assist," IEEE Transactions on Circuits and Systems II: Express Briefs, Dec. 2012 [accessed on Oct. 19, 2023], pp. 863-867, vol. 59, Issue 12, IEEE, DOI: 10.1109/TCSII.2012. 2231017, Retrieved from the Internet: <URL: https://ieeexplore. ieee.org/abstract/document/6423268>.

Nguyen, et al., "Rapido Testing and Modeling of Assisted Write and Read Operations for SRAMs," 2016 IEEE 25th North Atlantic Test Workshop (NATW), May 2016 [accessed on Oct. 19, 2023], pp. 28-33, IEEE, DOI: 10.1109/NATW.2016.14, Retrieved from the Internet: <URL: https://ieeexplore.ieee.org/document/7557843>.

Patel, et al., "Body Biased Sense Amplifier With Auto-Offset Mitigation for Low-Voltage SRAMs," IEEE Transactions on Circuits and Systems I: Regular Papers, Aug. 2021 [accessed on Oct. 19, 2023], pp. 3265-3278, vol. 68, Issue 8, IEEE, DOI: 10.1109/TCSI.2021.3081917, Retrieved from the Internet: <URL: https://ieeexplore.ieee.org/document/9442830>.

Penth, et al., "Memory Device, Assist Cell and Double Assist Cell for a Memory Device," Application and Drawings, Filed on Oct. 4, 2023, 32 Pages, Related GB Patent Application Serial No. 2315196. 2, IBM Docket No. P202205190GB01.

Yokoyama, et al., "Disturbance Aware Dynamic Power Reduction in Synchronous 2RW Dual-Port 8T SRAM by Self-Adjusting Wordline Pulse Timing," IEEE Journal of Solid-State Circuits, Jul. 2023 [accessed on Oct. 19, 2023], pp. 2098-2108, vol. 58, Issue 7, IEEE, DOI: 10.1109/JSSC.2022.3229828, Retrieved from the Internet: <URL: https://ieeexplore.ieee.org/document/10003987>.

Intellectual Property Office, "Patents Act 1977: Search Report under Section 17(5)," IPO, Mar. 28, 2024, 5 pages, GB Application No. 2315196.2, IBM Ref. No. P202205190GB01.

* cited by examiner

MEMORY DEVICE, ASSIST CELL AND DOUBLE ASSIST CELL FOR A MEMORY DEVICE

The present invention relates in general to data processing systems, in particular, to a memory device. The invention further relates to an assist cell and a double assist cell for a memory device.

BACKGROUND

High performance memories in high performance microprocessors usually comprise static random-access memory (SRAM) cells. An SRAM cell is a type of semiconductor memory cell that has low power consumption and fast access time relative to a dynamic random-access memory (DRAM) cell. An SRAM cell comprises a latch and one or more access devices. A latch is a data storage unit in a semiconductor device comprising of two inverters. An inverter has an input and an output having a voltage of opposite polarity to said input. The inverter is connected between a system power voltage level and system ground voltage level. The latch stores binary data, and the access device provides the capability to read and write data into the latch.

In a conventional single-port architecture, each bit in an SRAM cell is stored on four transistors that form two cross-coupled inverters operative as a storage element of the memory cell. Two additional transistors serve to control access to the storage element during read and write operations. A typical SRAM cell uses six transistors.

High performance memories usually comprise array of memory cells, built of six transistor SRAM cells. A cell column can be selected by activating one of the word lines. The cells connected to the chosen word line can be read or written through the connected bit lines.

There are two industry standard ways to read out an array of memory cells, the so-called ripple domino and the sense amplifier approach. In each case, the cell is driving the bit line connected to it or gets written by the same lines.

If an SRAM cell is not able to fully discharge the large capacitance of the bit line within a cycle the sense amplifier approach could be chosen. In this case, the sense amplifier, however, will detect its value by sensing the voltage difference of a bit line true and a bit line complement. As all bit lines are occupied by a read or write action, it is not possible to read and write the array in the same cycle. The sense amplifier approach could as well be chosen when the cell is strong enough to discharge the capacitance in a single cycle.

With the ripple domino approach array entities with a reduced number of word lines, so called banks, are used. The local read enables signals, a one hot bus, marks the bank to be read in the given cycle. The local evaluation circuit of the selected bank drives the global bit line to the read value, other local evaluation circuits stay electrically isolated from the global bit line. This scheme enables read and write in different banks of the same array in the same cycle.

SUMMARY

A memory device is proposed, comprising at least one memory bank, including a two-dimensional array of memory cells; a plurality of local bit lines connecting all memory cells in a first dimension of the two-dimensional array; a plurality of word lines connecting all memory cells in a second dimension of the two-dimensional array; at least one array of assist cells per memory bank, each array having one shared sense line and being arranged along memory cells and connected to by a bit line. The assist cells are configured as modified memory cells with a common sense line to provide a sense amplifier functionality.

Advantageously, the read or write signal of a memory cell is amplified with a small, in particular, minimum, logical, area and power impact by using instances of the memory cell for the amplification.

For instance, columns of the array may extend into the first dimension of the array and rows of the array may extend into the second dimension of the array, or vice versa.

The proposed memory device overcomes disadvantages of actual technologies. Bit lines get fully discharged in each condition and thus the low voltage performance and even low voltage operation of an array is enhanced. Using assist cells is also advantageous as resistances of wires and vias have grown in relation to the device strength.

The bistable circuit of the assist cells does not require the knowledge of the data value for the formation of the assist signal. Also, it enables the circuit to assist in a read action on top of the write assist. The additional assist cells speed up read and write actions.

In the proposed memory device, the footprint and silicon of a standard memory cell is taken and with few metal changes is used as assist circuit for read and write processes of the memory device. This procedure can be combined with different assist voltages. In the memory device the bit line is amplified according to the memory strength, as it is built from memory cells and sitting right next to them, thus assisting for read and write processes. Limited space on the memory device may be needed to account for statistical device differences.

Usage of modified memory cells keeps the area overhead small or even minimal as they share the same silicon with the original memory cells.

In an additional or alternative embodiment of the invention, the memory cells may be static random-access memory (SRAM) cells. An SRAM cell has low power consumption and fast access time. High performance memories in high performance microprocessors are widely comprising SRAM cells.

In an additional or alternative embodiment of the invention, in the assist cell two of at least six transistors of a memory cell that connect inner nodes of the memory cell with the local bit lines may be short-circuited. In particular, they may be short-circuited via a wire connection of the source and drain electrodes of the transistors. Thus, the bit lines may advantageously be driven to full supply voltage.

In an additional or alternative embodiment of the invention, in the assist cell gates of two of at least six transistors of the memory cell that connect the inner nodes of the memory cell with the local bit lines may be connected to a power line. This is another possibility to short-circuit the pass gate devices of a memory cell in order to modify it to the assist cell.

In an additional or alternative embodiment of the invention, a ground connection of the memory cell may be replaced by the common sense line which can be controlled from outside of the memory bank to enable or disable the assist cell. Thus, the source connections of the pulldown devices are not directly connected to ground connection, but to the new sense line that gets pulled down after the bit lines reach their sense margin, either driven by the assist cell or the write drivers.

In an additional or alternative embodiment of the invention, the memory device may further comprise a memory access circuitry, providing at least one multiplexer for the at least one memory bank per the first dimension associated with at least one local bit line of the at least one memory bank. Multiplexers may advantageously be used for addressing the memory cells.

In an additional or alternative embodiment of the invention, the at least one multiplexer may transfer the local bit lines to global bit lines for output. Thus, the memory cells may advantageously be addressed.

In an additional or alternative embodiment of the invention, the transfer of the local bit lines to the global bit lines may be driven by a local read enable line. Thus, standard addressing schemes may be used for addressing the memory device for read/write processes.

In an additional or alternative embodiment of the invention, an input/output device may be provided comprising output drivers for transferring the global bit lines to output lines. Thus, stable output signals may result.

In an additional or alternative embodiment of the invention, two memory banks may be arranged in a double memory bank. Thus, state of the art layouts of memory devices may advantageously be used to be modified according to the proposed memory device using assist cells for read/write processes.

In an additional or alternative embodiment of the invention, the memory device may further comprise a memory access circuitry, providing at least one multiplexer for the double memory bank per the first dimension associated with at least one local bit line of each of two neighboring memory banks in the double memory bank. Multiplexers may advantageously be used for addressing the memory cells.

In an additional or alternative embodiment of the invention, the at least one multiplexer may transfer the local bit lines to global bit lines for output. Thus, the memory cells may advantageously be addressed. In particular, the transfer of the local bit lines may be driven by a local read enable line. Thus, standard addressing schemes may be used for addressing the memory device for read/write processes.

In an additional or alternative embodiment of the invention, an input/output device may be provided comprising output drivers for transferring the global bit lines to output lines. Thus, stable output signals may result.

In an additional or alternative embodiment of the invention, the assist cells in the array of assist cells may be arranged pairwise as double assist cells. Advantageously, the standard layout of a memory device according to state of the art may be used, where memory cells are arranged pairwise in arrays, to modify standard memory cells to double assist cells.

Further, an assist cell for a memory device is proposed, being configured as a modified memory cell of the memory device with a common sense line to provide a sense amplifier functionality.

Advantageously, with the proposed assist cell the read or write signal of a memory cell is amplified with minimum logical, area and power impact by using instances of the memory cell for the amplification.

In the proposed assist cell, the footprint and silicon of a standard memory cell is taken and with few metal changes is used as assist circuit for read and write processes of the memory device. This procedure can be combined with different assist voltages. In the memory device the bit line is amplified according to the memory strength, as it is built from memory cells and sitting right next to them, thus assisting for read and write processes. Limited space on the memory device may be needed to account for statistical device differences.

In an additional or alternative embodiment of the invention, in the assist cell two of at least six transistors of a memory cell, that connect the inner nodes of the memory cell with the local bit lines, may be short-circuited via a wire connection of the source and drain electrodes of the transistors, wherein a ground connection of the memory cell may be replaced by the common sense line, which can be controlled from outside of the memory bank, to enable or disable the assist cell. Thus, the bit lines of the memory device may advantageously be driven to full supply voltage. The source connections of the pulldown devices are not directly connected to ground connection, but to the new sense line that gets pulled down after the bit lines reach their sense margin, either driven by the assist cell or the write drivers.

In an additional or alternative embodiment of the invention, in the assist cell gates of two of at least six transistors of the memory cell, that connect the inner nodes of the assist cell with the local bit lines, may be connected to a power line, wherein a ground connection of the memory cell may be replaced by a common sense line, which can be controlled from outside of the memory bank, to enable or disable the assist cell. This is another possibility to short-circuit the pass gate devices of a memory cell in order to modify it to the assist cell.

Further, a double assist cell for a memory device is proposed, being configured as two modified memory cells of the memory device with a common sense line to provide Advantageously, the standard layout of a memory device according to state of the art may be used, where memory cells are arranged pairwise in arrays, to modify standard memory cells to double assist cells.

Advantageously, with the proposed double assist cell the read or write signal of a memory cell is amplified with minimum logical, area and power impact by using instances of the memory cell for the amplification.

In the proposed double assist cell, the footprint and silicon of a standard memory cell is taken and with few metal changes is used as assist circuit for read and write processes of the memory device. This procedure can be combined with different assist voltages. In the memory device the bit line is amplified according to the memory strength, as it is built from memory cells and sitting right next to them, thus assisting for read and write processes. Limited space on the memory device may be needed to account for statistical device differences.

In an additional or alternative embodiment of the invention, in the double assist cell two of at least six transistors of a single memory cell that connect the inner nodes of the single memory cell with the local bit lines may be short-circuited via a wire connection of the source and drain electrodes of the transistors, wherein a ground connection of the two memory cells may be replaced by the common sense line which can be controlled from outside of the memory bank, to enable or disable the double assist cell. Thus, the bit lines of the memory device may advantageously be driven to full supply voltage. The source connections of the pulldown devices are not directly connected to ground connection, but to the new sense line that gets pulled down after the bit lines reach their sense margin, either driven by the double assist cell or the write drivers.

In an additional or alternative embodiment of the invention, in the double assist cell gates of two of at least six transistors of the single memory cell that connect the inner nodes of the single memory cell with the local bit lines may be connected to a power line, wherein a ground connection of the two memory cells may be replaced by a common sense line which can be controlled from outside of the memory bank, to enable or disable the double assist cell. This is another possibility to short-circuit the pass gate devices of a memory cell in order to modify it to the double assist cell.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments.

DETAILED DESCRIPTION

Figure 1:
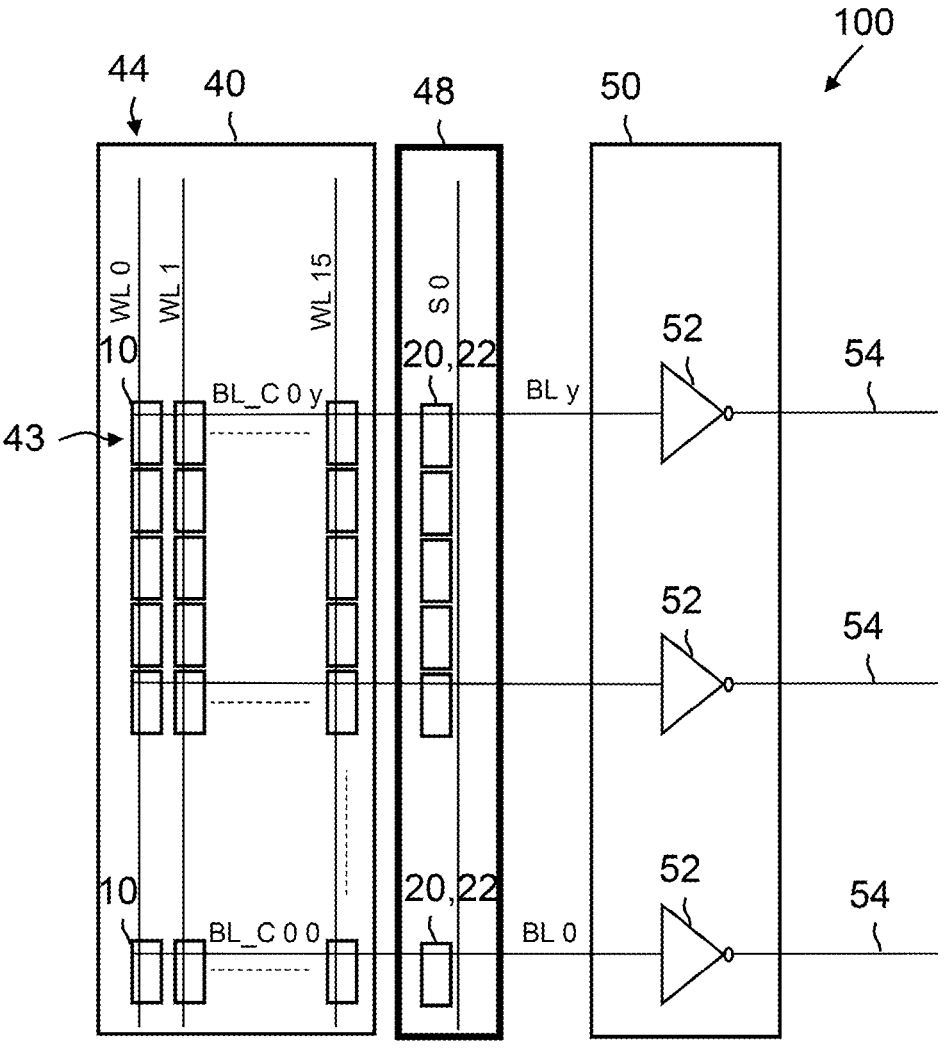
FIG. 1 depicts a general layout of a memory device according to an embodiment of the invention.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

The illustrative embodiments described herein provide a memory device, comprising at least one memory bank, including a two-dimensional array of memory cells; a plurality of local bit lines connecting all memory cells in a first dimension of the two-dimensional array; a plurality of word lines connecting all memory cells in a second dimension of the two-dimensional array; at least one array of assist cells per memory bank, each array having one shared sense line and being arranged along memory cells and connected to by a bit line. The assist cells are configured as modified memory cells with a common sense line to provide a sense amplifier functionality.

FIG. 1 depicts a general layout of a memory device 100 according to an embodiment of the invention.

The memory device 100 in FIG. 1 comprises a memory bank 40, including a two-dimensional array of memory cells 10. The memory cells 10 are static random access memory cells.

The memory bank 40 comprises a number of sixteen memory cells 10 in a first dimension 43, a row, of the two-dimensional array, numbered 0 to 15, and a number of y+1 memory cells 10 in a second dimension 44, a column, of the two-dimensional array.

Further the memory device 100 comprises an array 48 of assist cells 20, 22. There is one assist cell 20, 22 in the first dimension 43 of the array 48 of assist cells 20, 22. The array 48 has one shared sense line S0 (FIGS. 3 to 6) and is arranged along memory cells 10 connected by a bit line BL_C.

In the embodiment shown the array 48 of assist cells 20, 22 is connected to the memory bank 40.

A plurality of local bit lines BL_C00 to BL_C0y is connecting all memory cells 10 in the first dimension 43 of the two-dimensional array, whereas a plurality of word lines WL0 to WL15 is connecting all memory cells 10 in the second dimension 44 of the two-dimensional array. Of course, in other embodiments the number of word lines may differ from sixteen.

The assist cells 20, 22 are configured as modified memory cells 10 with common sense line S to provide a sense amplifier functionality.

An input/output device 50 is provided comprising output drivers 52 for transferring the global bit lines BL0 to BLy to output lines 54.

Thus, FIG. 1 shows a memory bank 40 of memory cells 10 with modified additional memory cells 20, 22 used as assist circuits. The silicon of these assist cells 20, 22 is identical to the original SRAM memory cells 10. The word lines WL are either tied to "1" or the respective pass gate devices are shorted as may be seen from FIGS. 3 to 6. The ground connection VSS is replaced with the sense signal S. This offers an area efficient way of amplifying read and write signals of the memory device 100.

For read processes the word line WL of the memory cells 10 to read opens, the local bit lines BL_C get driven by the connected memory cells 10. After reaching the sense margin, the sense signal gets pulled down. This starts the bit line BL_C amplification, accelerating the read process.

For write processes write drivers don't always reach the full supply voltage. By firing the sense line S0, S1 for a write process, the assist cells 20, 22 support the write process by driving the bit lines BL to full supply voltage.

Figure 2:
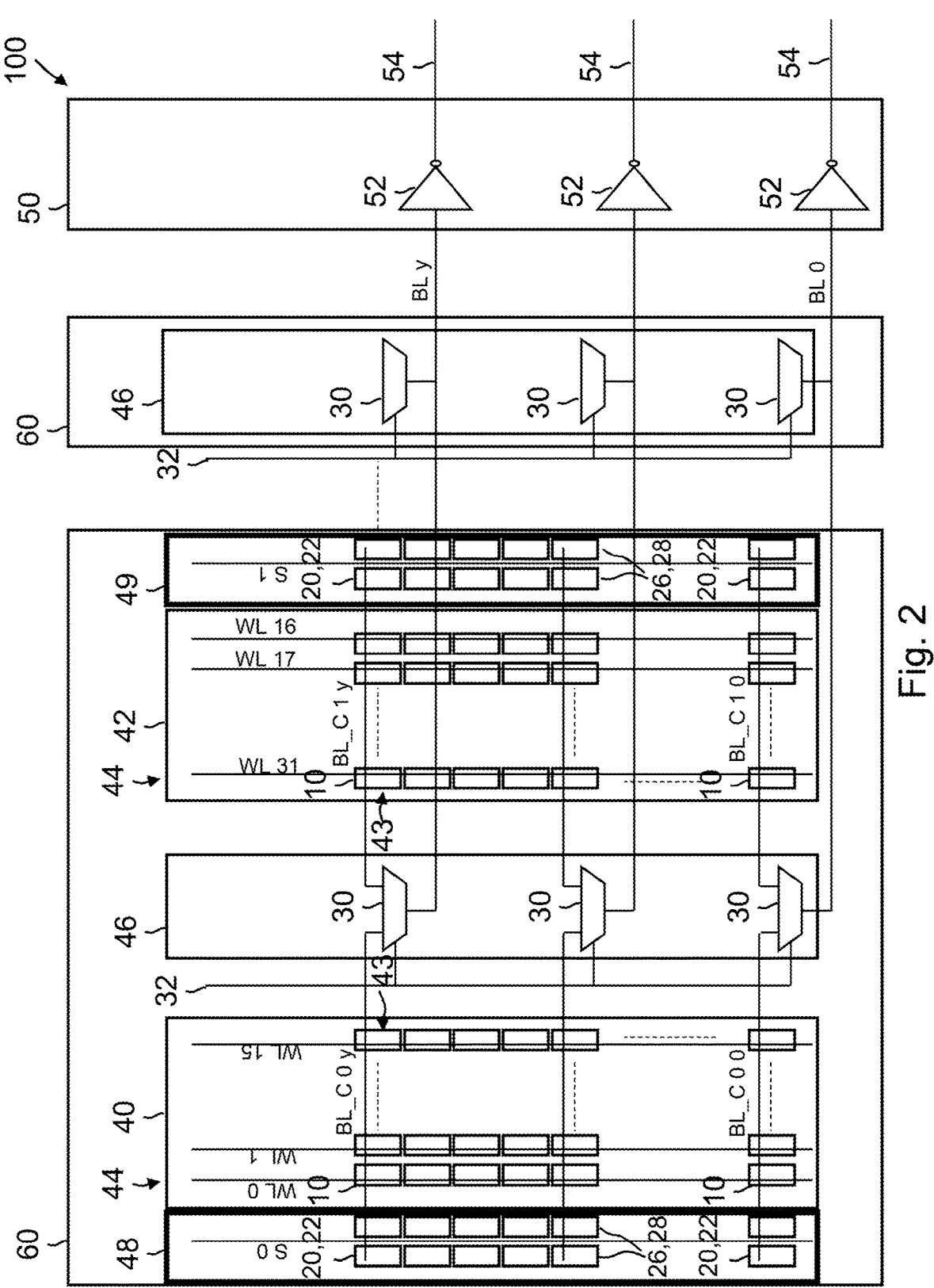
FIG. 2 depicts a general layout of a memory device according to a further embodiment of the invention.

FIG. 2 depicts a general layout of a memory device 100 according to a further embodiment of the invention.

The memory device 100 in FIG. 2 comprises a plurality of memory banks 40, 42, wherein each memory bank 40, 42 includes a two-dimensional array of memory cells 10 and a memory cell access circuitry 46. The memory cells 10 are static random access memory cells.

The memory bank 40 comprises a number of sixteen memory cells 10 in a first dimension 43, a row, of the two-dimensional array, numbered 0 to 15, and a number of y+1 memory cells 10 in a second dimension 44, a column, of the two-dimensional array. The memory bank 42 has the same size. The memory cells 10 of the first dimension 43 are numbered 16 to 31.

Further the memory device 100 comprises at least one array 48, 49 of assist cells 20, 22 per memory bank 40, 42. There are two assist cells 20, 22 in the first dimension 43 of the array 48, 49 of assist cells 20, 22. Each array 48, 49 has one shared sense line S0, S1 (FIGS. 3 to 6) and is arranged along memory cells 10 connected by a bit line BL_C.

In the embodiment shown the array 48 of assist cells 20, 22 is connected to the memory bank 40, whereas the array 49 of assist cells 20, 22 is connected to the memory bank 42. The memory cell access circuitry 46 serves both memory banks 40, 42.

A plurality of local bit lines BL_C00 to BL_C0y, BL_C10 to BL_Cly, respectively, is connecting all memory cells 10 in the first dimension 43 of the two-dimensional array, whereas a plurality of word lines WL0 to WL15, and WL16 to WL31, respectively, is connecting all memory cells 10 in the second dimension 44 of the two-dimensional array.

The assist cells 20, 22 are configured as modified memory cells 10 with a common sense line S to provide a sense amplifier functionality.

The memory cell access circuitry 46 comprises multiplexers 30. At least one multiplexer 30 is provided in the at least one memory bank 40, 42 per the first dimension 43 associated with at least one local bit line BL_C of one of the memory banks 40, 42 out of the plurality of memory banks 40, 42. The multiplexers 30 transfer the local bit lines BL_C00 to BL_C0y, BL_C10 to BL_C1y, respectively, to global bit lines BL0 to BLy for output. The transfer of the local bit lines BL_C to the global bit lines BL is driven by a local read enable line 32.

An input/output device 50 is provided comprising output drivers 52 for transferring the global bit lines BL0 to BLy to output lines 54.

In the embodiment shown in FIG. 2 two memory banks 40, 42 are arranged in one double memory bank 60. The double memory bank 60 comprises two arrays 48, 49 of assist cells 20 and one memory cell access circuitry 46 serving both memory banks 40, 42. The two arrays 48, 49 of assist cells 20 comprise double assist cells 26, 28, being configured as two modified memory cells 10 of the memory device 100 with a common sense line S to provide the function of a sense amplifier.

The second double memory bank 60 is depicted with the memory cell access circuitry 46 only for simplification of the Figure. It is to be understood, that this double memory bank 60 also comprises two memory banks 40, 42 and two arrays 48, 49 of assist cells 20.

Figure 3:
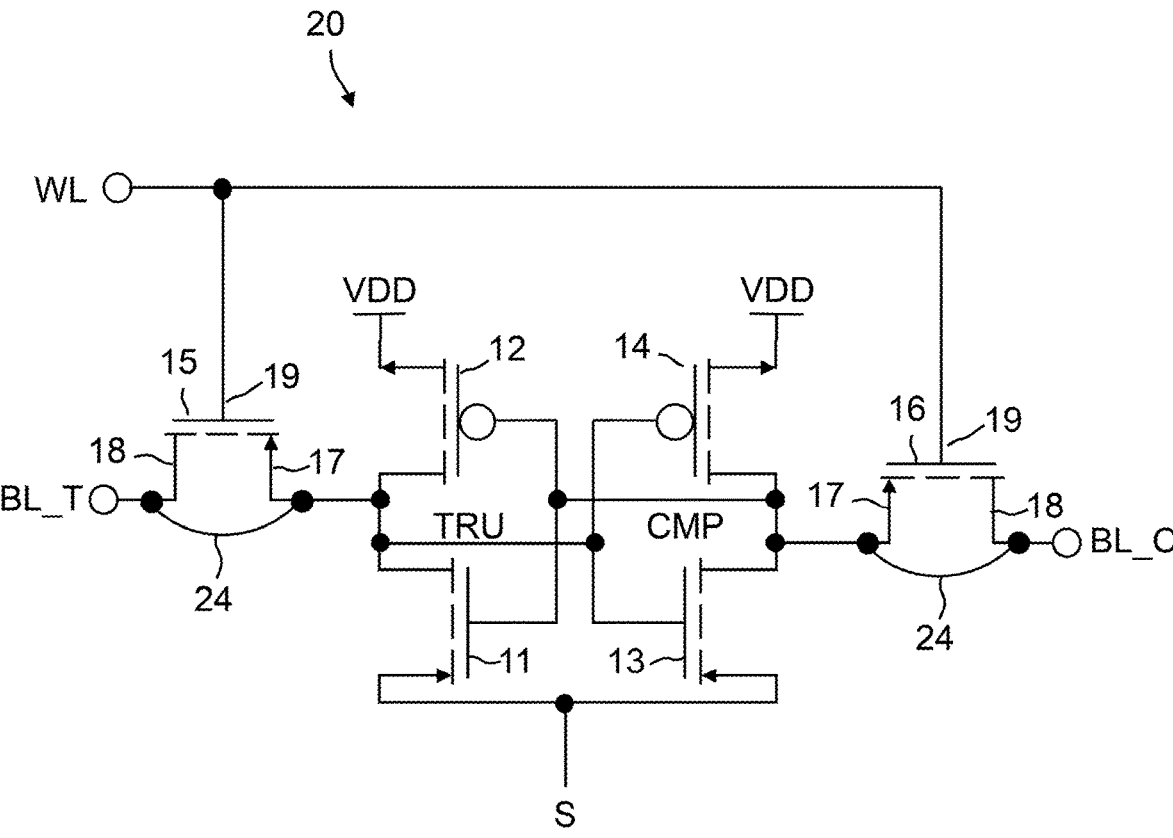
FIG. 3 depicts a layout of an assist cell for a memory device according to an embodiment of the invention.

FIG. 3 depicts a layout of an assist cell 20 for a memory device 100 according to an embodiment of the invention.

FIG. 3 shows a six transistor SRAM memory cell 10 with two metal changes to turn it into an assist circuit 20.

In the assist cell 20 two transistors 15, 16 of at least six transistors 11, 12, 13, 14, 15, 16 of a memory cell 10 that connect inner nodes TRU, CMP of the memory cell 10 with the local bit lines BL_T, BL_C are short-circuited. In this embodiment, they are short-circuited via a wire connection 24 of the source and drain electrodes 17, 18 of the transistors 15, 16.

Thus, the pass gate devices 15, 16 of the assist cells 20 are short-circuited. That helps to drive the bit lines BL_T, BL_C to full supply voltage.

A ground connection of the memory cell 10 is replaced by a common sense line S which can be controlled from outside of the memory bank 40, 42 to enable or disable the assist cell 20.

Thus, the source connections of the pull down devices 11, 12, 13, 14 are not directly connected to the ground VSS, but to a new sense line S that gets pulled down after the bit lines BL_T, BL_C reach their sense margin, either driven by the memory cell 10 or the write drivers.

The function of the proposed assist cell 20 is, that at the beginning of each read or write cycle, the bit lines BL_T, BL_C and the inner nodes of the assist circuit TRU, CMP are precharged. The sense node is not actively driven from outside.

For both, read and write, one of the bit lines BL_T, BL_C will get pulled down while the other of the bit lines BL_T, BL_C will stay at its precharge level. As soon as the voltage difference of the inner cell nodes TRU and CMP is high enough, the sense node will get pulled down. This starts the amplification of the voltage difference till full supply voltage.

It is possible to implement set dependent sense lines S to keep the possibility not to write all memory cells 10 along the active word line WL.

Figure 4:
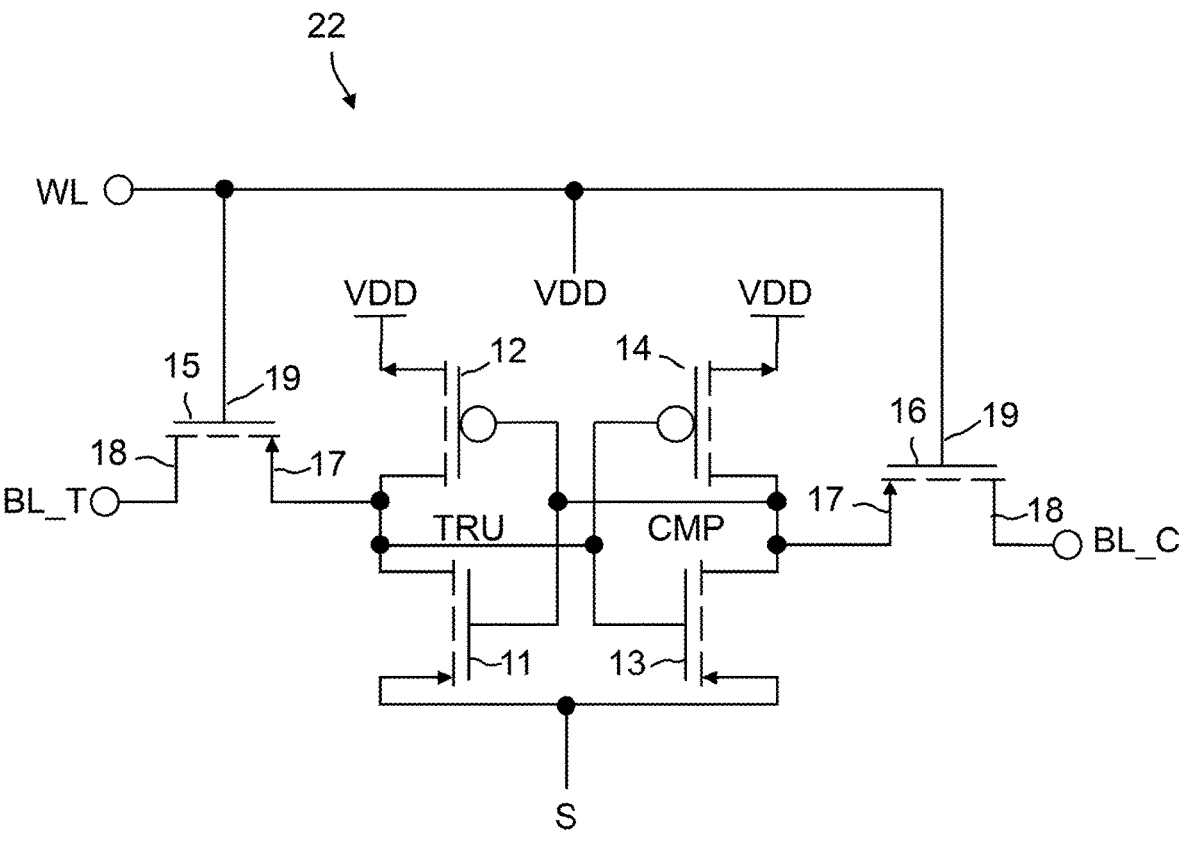
FIG. 4 depicts a layout of an assist cell for a memory device according to a further embodiment of the invention.

FIG. 4 depicts a layout of an assist cell 22 for a memory device 100 according to a further embodiment of the invention.

In the assist cell 22 gates 19 of two transistors 15, 16 of at least six transistors 11, 12, 13, 14, 15, 16 of the memory cell 10 that connect the inner nodes TRU, CMP of the memory cell 10 with the local bit lines BL_T, BL_C are connected to a power line VDD. Thus, the word line WL tied to the power line VDD.

As in the embodiment shown in FIG. 3, the ground connection of the memory cell 10 is replaced by a common sense line S, which can be controlled from outside of the memory bank 40, 42 to enable or disable the assist cell 22.

Figure 5:
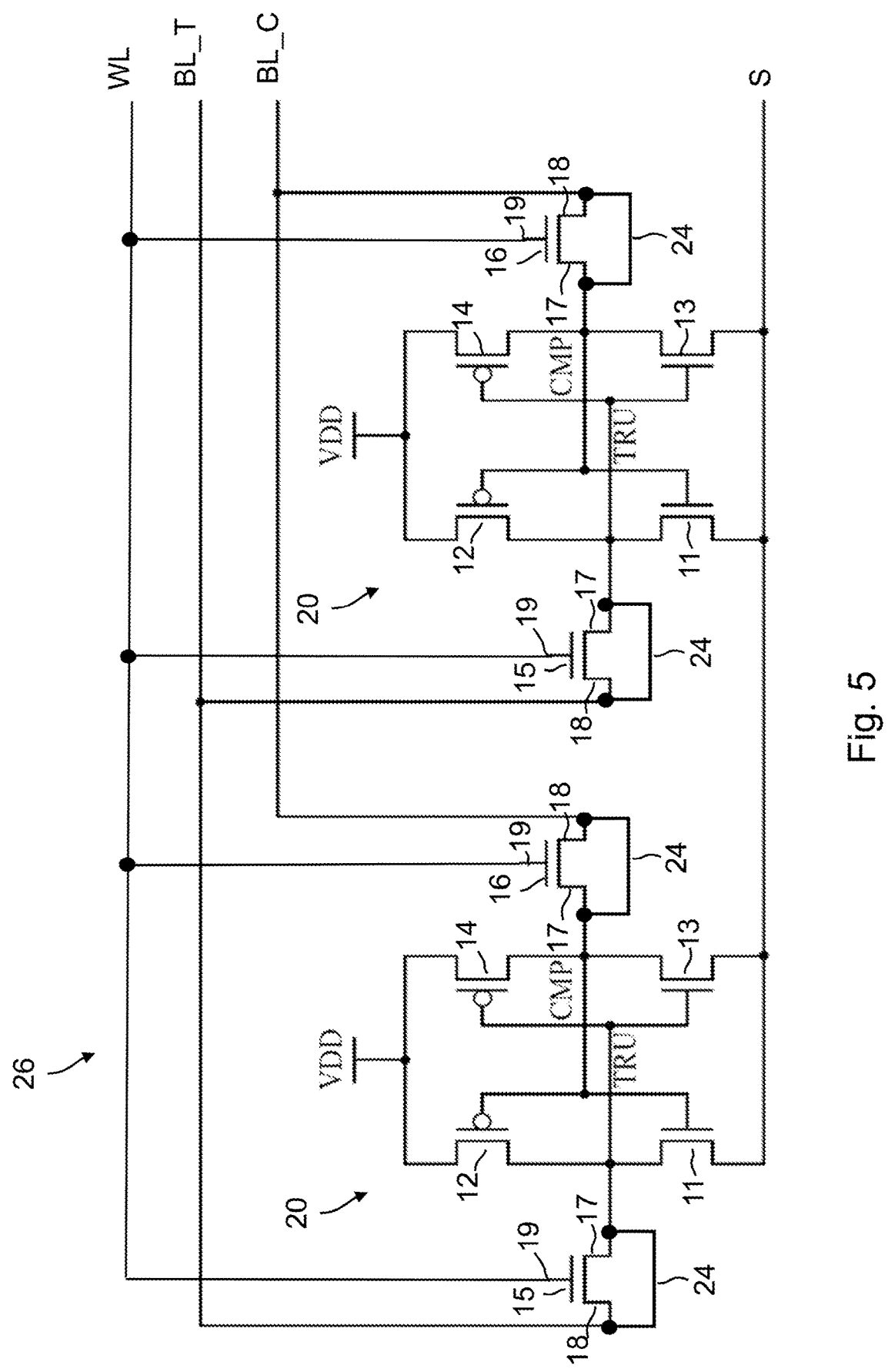
FIG. 5 depicts a layout of a double assist cell for a memory device according to an embodiment of the invention.

FIG. 5 depicts a layout of a double assist cell 26 for a memory device 100 according to an embodiment of the invention. The double assist cell 26 comprises two assist cells 20.

As shown in FIG. 2, the assist cells 20, 22 in the arrays 48, 49 of assist cells 20, 22 are arranged pairwise as double assist cells 26, 28. In FIG. 5 one embodiment of these double assist cells 26, 28 is depicted.

In the double assist cell 26 two transistors 15, 16 of at least six transistors 11, 12, 13, 14, 15, 16 of a single memory cell 10 that connect the inner nodes TRU, CMP of the single memory cell 10 with the local bit lines BL_T, BL_C are short-circuited via a wire connection 24 of the source and drain electrodes 17, 18 of the transistors 15, 16.

The ground connection of the two memory cells 10 is replaced by a common sense line S which can be controlled from outside of the memory bank 40, 42, to enable or disable the double assist cell 26.

Figure 6:
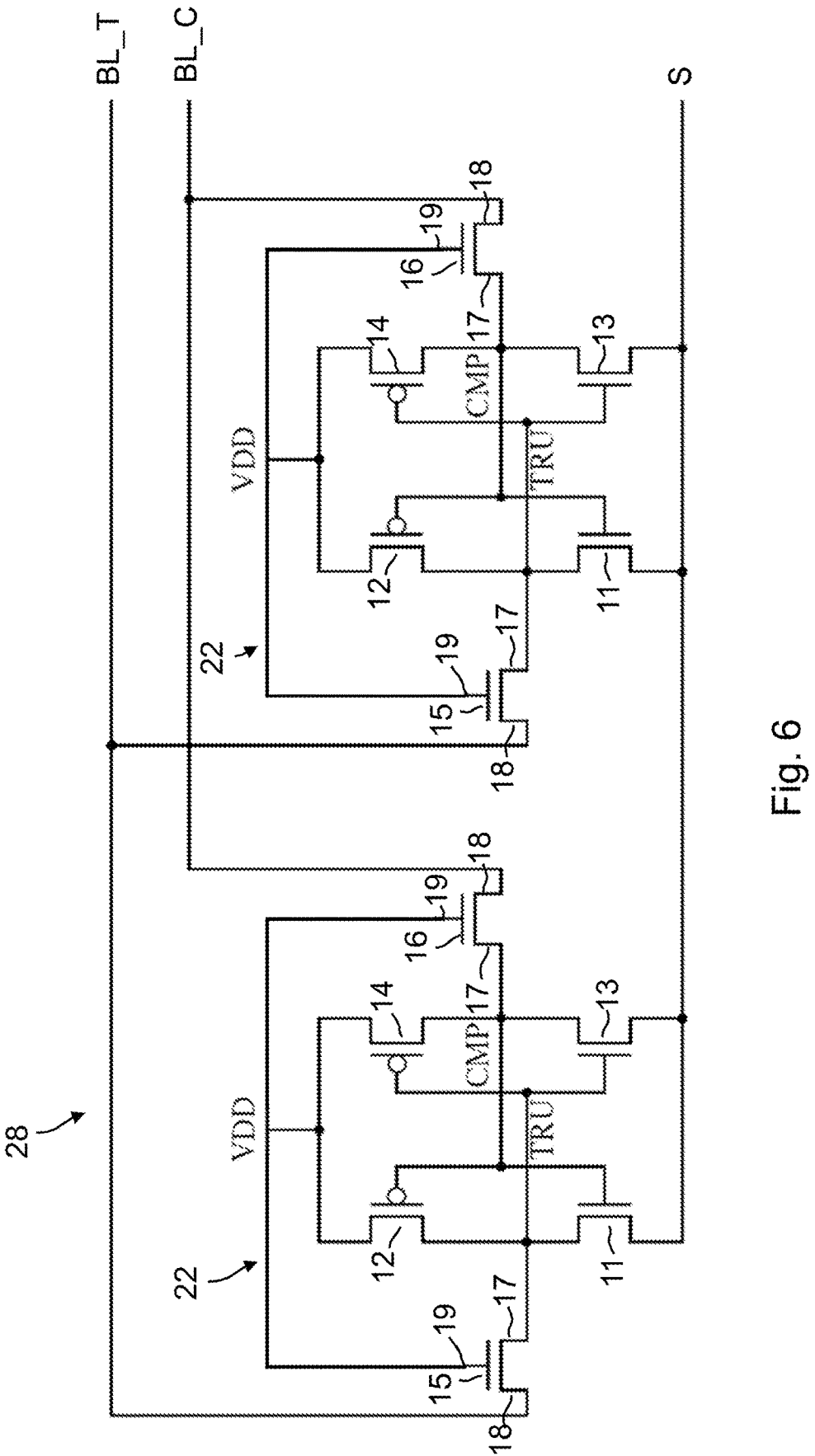
FIG. 6 depicts a layout of a double assist cell for a memory device according to a further embodiment of the invention.

FIG. 6 depicts a layout of a double assist cell 28 for a memory device 100 according to a further embodiment of the invention. The double assist cell 28 comprises two assist cells 22.

In the double assist cell 28 gates 19 of two transistors 15, 16 of at least six transistors 11, 12, 13, 14, 15, 16 of the single memory cell 10 that connect the inner nodes TRU, CMP of the single memory cell 10 with the local bit lines BL_T, BL_C are connected to a power line VDD.

The ground connection of the two memory cells 10 is replaced by a common sense line S which can be controlled from outside of the memory bank 40, 42, to enable or disable the double assist cell 28.

What is claimed is:

1. A memory device, comprising:
   at least one memory bank, including a two-dimensional array of memory cells;
   a plurality of local bit lines connecting all memory cells in a first dimension of the two-dimensional array;
   a plurality of word lines connecting all memory cells in a second dimension of the two-dimensional array;
   at least one array of assist cells per memory bank, each array having one shared sense line and being arranged along memory cells and connected to by a bit line; and
   wherein the assist cells are configured as modified memory cells with a common sense line to provide a sense amplifier functionality, and wherein in the assist cells two of at least six transistors of an assist memory cell that connect inner nodes of the memory cell with the local bit lines are short-circuited, in particular, are short-circuited via a wire connection of source and drain electrodes of the transistors.

2. The memory device according to claim 1, wherein the memory cells are static random access memory cells.

3. The memory device according to claim 1, wherein in assist cell gates of two of at least six transistors of the memory cell that connect the inner nodes of the memory cell with the local bit lines are connected to a power line.

4. The memory device according to claim 1, wherein a ground connection of a memory cell is replaced by the common sense line which can be controlled from outside of the memory bank to enable or disable the assist cell.

5. The memory device according to claim 1, further comprising a memory cell access circuitry, providing at least one multiplexer for the at least one memory bank per the first dimension associated with at least one local bit line of the at least one memory bank.

6. The memory device according to claim 5, wherein the at least one multiplexer transfers the local bit lines to global bit lines for output.

7. The memory device according to claim 6, wherein the transfer of the local bit lines to the global bit lines is driven by a local read enable line.

8. The memory device according to claim 1, wherein an input/output device is provided comprising output drivers for transferring global bit lines to output lines.

9. The memory device according to claim 1, wherein two memory banks are arranged in a double memory bank.

10. The memory device according to claim 9, further comprising a memory cell access circuitry, providing at least one multiplexer for the double memory bank per the first dimension associated with at least one local bit line of each of two neighboring memory banks in the double memory bank.

11. The memory device according to claim 10, wherein the at least one multiplexer transfers the local bit lines to global bit lines for output, in particular wherein the transfer of the local bit lines is driven by a local read enable line.

12. The memory device according to claim 9, wherein an input/output device is provided comprising output drivers for transferring global bit lines to output lines.

13. The memory device according to claim 1, wherein the assist cells in the array of assist cells are arranged pairwise as double assist cells.

14. An assist cell for a memory device, being configured as a modified memory cell of the memory device with a common sense line to provide a sense amplifier functionality, wherein in the assist cell two of at least six transistors of a memory cell that connect inner nodes of the memory cell with local bit lines are short-circuited, in particular, are short-circuited via a wire connection of source and drain electrodes of the transistors.

15. The assist cell according to claim 14, wherein in the assist cell two of at least six transistors of a memory cell, that connect the inner nodes of the memory cell with the local bit lines, are short-circuited via a wire connection of the source and drain electrodes of the transistors:

wherein a ground connection of the memory cell is replaced by the common sense line, which can be controlled from outside of a memory bank, to enable or disable the assist cell.

16. The assist cell according to claim 14, wherein in assist cell gates of two of at least six transistors of the memory cell, that connect inner nodes of the assist cell with the local bit lines, are connected to a power line:

wherein a ground connection of the memory cell is replaced by a common sense line, which can be controlled from outside of a memory bank, to enable or disable the assist cell.

17. A double assist cell for a memory device, being configured as two modified memory cells of the memory device with a common sense line to provide a function of a sense amplifier; and wherein in the double assist cell two of at least six transistors of a memory cell that connect inner nodes of the memory cell with local bit lines are short-circuited, in particular, are short-circuited via a wire connection of source and drain electrodes of the transistors.

18. The double assist cell according to claim 17, wherein in the double assist cell two of at least six transistors of a single memory cell that connect inner nodes of the single memory cell with local bit lines are short-circuited via a wire connection of source and drain electrodes of the transistors:

wherein a ground connection of the two memory cells is replaced by the common sense line which can be controlled from outside of a memory bank, to enable or disable the double assist cell.

19. The double assist cell according to claim 17, wherein in double assist cell gates of two of at least six transistors of a single memory cell that connect inner nodes of the single memory cell with local bit lines are connected to a power line:

wherein a ground connection of the two memory cells is replaced by a common sense line which can be controlled from outside of a memory bank, to enable or disable the double assist cell.

\* \* \* \* \*